(12) United States Patent
Nagaya et al.

(10) Patent No.: US 6,600,361 B2
(45) Date of Patent: Jul. 29, 2003

(54) SEMICONDUCTOR DEVICE

(75) Inventors: Masafumi Nagaya, Miyazaki (JP); Masahiko Nakajikkoku, Miyazaki (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/977,490

(22) Filed: Oct. 16, 2001

(65) Prior Publication Data

US 2002/0051390 A1 May 2, 2002

(30) Foreign Application Priority Data

Oct. 18, 2000 (JP) .................................. 2000-317913

(51) Int. Cl.[7] .................................................. G05F 1/10
(52) U.S. Cl. ........................ 327/538; 327/541; 327/543
(58) Field of Search ................................. 327/530, 143, 327/538–543; 323/313–315, 901

(56) References Cited

U.S. PATENT DOCUMENTS 5,191,555 A    3/1993  Tabacco et al. ......... 365/230.08
5,917,765 A *  6/1999  Morishita et al. ........... 365/201
6,002,242 A * 12/1999  Migliavacca ................ 323/312
6,356,064 B1 * 3/2002  Tonda ........................ 323/313
6,441,680 B1 * 8/2002  Leung et al. ............... 327/541

FOREIGN PATENT DOCUMENTS

JP            8-186484 A  *  7/1996

* cited by examiner

Primary Examiner—Terry D. Cunningham
Assistant Examiner—Long Nguyen
(74) Attorney, Agent, or Firm—Rabin & Berdo, P.C.

(57) ABSTRACT

A semiconductor device comprises a first current mirror circuit (101) which has an input terminal (101I) and an output terminal (101O), a second current mirror circuit (102) which has an input terminal (102I) and an output terminal (102O) wherein the input terminal (102I) is coupled with the output terminal (101O) wherein the output terminal (102O) is coupled with said input terminal (101I) and a start-up circuit (103) which supplies current to input terminal (102I) based on voltage on the input terminal (101I).

4 Claims, 4 Drawing Sheets

SEMICONDUCTOR DEVICE

BACKGROUND OF THE INVENTION

1. Field of the Invention

The present invention generally relates to technology for a semiconductor device, and more particularly, to a start-up circuit included a constant current circuit.

This application is a counterpart of Japanese patent application, Serial Number 317913/2000, filed Oct. 18, 2000, the subject matter of which is incorporated herein by reference.

2. Description of the Related Art

A conventional semiconductor device is shown in FIG. 77 of U.S. Pat. No. 5,191,555. The conventional semiconductor device are comprised of a lot of circuit elements in order to supply a stable constant current.

Recently, the semiconductor device is demanded to be driven by low current, low voltage and fast speed. Also, the semiconductor device is demanded to be manufactured small.

However, the conventional semiconductor device can not satisfy above demands, because the conventional semiconductor device has a lot of circuit elements and a large-scale area for manufacturing the circuit elements.

SUMMARY OF THE INVENTION

It is an object of the present invention to provide a semiconductor device that may be driven by low current.

It is another object of the present invention to provide a semiconductor device that may be driven by low voltage.

It is still another object of the present invention to provide a semiconductor device that may be driven at fast speed.

It is further object of the present invention to provide a semiconductor device that may reduce circuit scale.

According to one aspect of the present invention, for achieving the above object, there is provided a semiconductor device, is provided with a first current mirror circuit which has an input terminal and an output terminal, a second current mirror circuit which has an input terminal and an output terminal, wherein the input terminal of the second current mirror circuit is coupled with the output terminal of the first current mirror circuit, wherein the output terminal of the second current mirror circuit is coupled with the input terminal of the first current mirror circuit, a start-up circuit which supplies current to the input terminal of the second current mirror circuit in accordance with voltage of the input terminal of the first current mirror circuit.

The above and further objects and novel features of the invention will more fully appear from the following detailed description, appended claims and the accompanying drawings.

DETAILED DESCRIPTION OF THE PREFERRED EMBODIMENTS

In what follows, the present invention will be explained with embodiments of the present invention. However, the invention is not limited to the specific embodiments. Moreover, not all the combinations of the characteristics of the present invention described in the embodiments are essential to the problem solving means by the present invention.

(First Preferred Embodiment)

Figure 1:
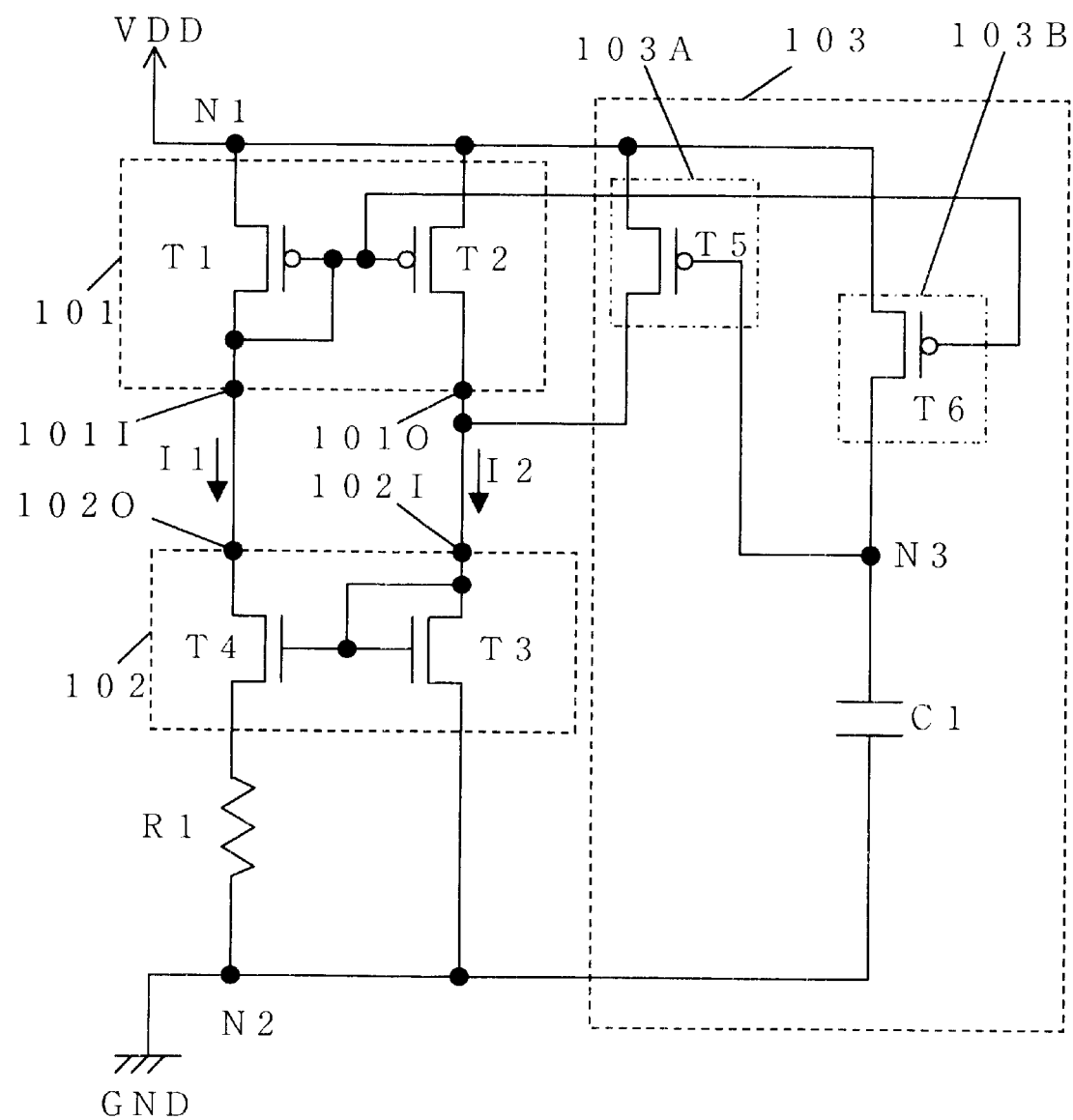
FIG. 1 is a circuit diagram showing a semiconductor device according to a first preferred embodiment of the present invention.

A semiconductor device according to a first preferred embodiment of the present invention will be described with reference to FIG. 1. FIG. 1 is a circuit diagram showing the semiconductor device according to the first preferred embodiment of the present invention.

First, the semiconductor device according to the first preferred embodiment of the present invention comprises a node N1, a node N2, a current mirror circuit 101, a current mirror circuit 102, a resistor R1 and a start-up circuit 103. The node N1 is coupled with a power supply voltage node VDD which supplies the node N1 with a first voltage, i.e. a power supply voltage VDD or a driving voltage VDD. The first voltage has a value such as 5 V[Voltage]. The node N2 is coupled with a ground node GND which supplies the node N2 with a second voltage, i.e. a reference voltage GND or a ground voltage GND. The second voltage has a value such as 0 V.

The current mirror circuit 101 comprises an input terminal 101I, an output terminal 101O, first conductive type transistors T1 and T2, i.e. PMOS transistor (p-channel MOSFET). PMOS transistor comprises a control electrode (a gate electrode), a first electrode (a source electrode or a drain electrode) and a second electrode (a drain electrode or a source electrode). When the difference of voltage between the source electrode and the gate electrode of PMOS transistor exceeds a certain amount of voltage (a gate-source voltage VGS), current flows between the source electrode and the drain electrode (in other words, a current path occurs between the source and drain electrodes). When the difference of voltage between the source electrode and the gate electrode of PMOS transistor does not exceed the gate-source voltage VGS, current does not flow between the source electrode and the drain electrode. A source electrode of PMOS transistor T1 is connected to the node N1. PMOS transistor T1 has a gate electrode and a drain electrode connected to the input terminal 101I. A source electrode of PMOS transistor T2 is connected to the node N1. A gate electrode of PMOS transistor T2 is connected to the gate electrode of PMOS transistor T1. A drain electrode of PMOS transistor T2 is connected to the output terminal 101O.

The current mirror circuit 102 comprises an input terminal 102I, an output terminal 102O, second conductive type transistors T3 and T4, i.e. NMOS transistor (N-channel MOSFET). NMOS transistor comprises a control electrode (a gate electrode), a first electrode (a source electrode or a drain electrode) and a second electrode (a drain electrode or a source electrode). When the difference of voltage between the source electrode and the gate electrode of NMOS transistor exceeds a certain amount of voltage (a gate-source voltage VGS), current flows between the source electrode and the drain electrode. When the difference of voltage between the source electrode and the gate electrode of NMOS transistor does not exceed the gate-source voltage VGS, current does not flow between the source electrode and the drain electrode. A source electrode of NMOS transistor T3 is connected to the node N2. NMOS transistor T3 has a gate electrode and a drain electrode connected to the input terminal 102I. A source electrode of NMOS transistor T4 is connected to the resistor R1. A gate electrode of NMOS transistor T4 is connected to the gate electrode of NMOS transistor T3. A drain electrode of NMOS transistor T4 is connected to the output terminal 102O. The input terminal 102I of the current mirror circuit 102 is coupled with the output terminal 101O of the current mirror circuit 101. The output terminal 102O of the current mirror circuit 102 is coupled with the input terminal 101I of the current mirror circuit 101.

The resistor R1 has two terminals. One terminal is connected to the source electrode of NMOS transistor T4, the other terminal is connected to the node N2. The resistor R1 comprises such as PMOS or NMOS transistor. When the resistor R1 comprises NMOS transistor, a gate electrode is connected to the node N1, a source electrode is connected to the node N2 and a drain electrode is connected to the source electrode of NMOS transistor T4. The intensity of a current I1 flowing at the input terminal 101I and the intensity of a current I2 flowing at the output terminal 101O depend on a current gain of the current mirror circuit 102. Further, the intensity of the current I1 depends on the value of the resistor R1.

The start-up circuit 103 comprises a switch 103A, a switch 103B, a node N3 and a capacitance element C1, i.e. capacitor. The switches 103A and 103B have an ON state and an OFF state respectively. The switch 103A comprises PMOS transistor T5 and the switch 103B comprises PMOS transistor T6.

A gate electrode of PMOS transistor T5 is connected to the node N3. A source electrode is connected to the node N1 and a drain electrode is connected to the input terminal 102I of the current mirror circuit 102. When a certain amount of voltage (a gate-source voltage VGS) occurs between the gate and source electrodes of PMOS transistor T5, current flows between the source electrode and the drain electrode. When the gate-source voltage VGS does not occur between the gate and source electrodes, current does not flow between the source electrode and the drain electrode.

A gate electrode of PMOS transistor T6 is connected to the gate electrode of PMOS transistor T1 or T2 (or the input terminal 101I). PMOS transistor T1 and PMOS transistor T6 comprise a current mirror circuit. A source electrode of PMOS transistor T6 is connected to the node N1 and a drain electrode thereof is connected to the node N3. When the difference of voltage between the source electrode and the gate electrode of PMOS transistor T6 exceeds the gate-source voltage VGS, current flows between the source electrode and the drain electrode. When the difference of voltage between the source electrode and the gate electrode of PMOS transistor T6 does not exceed the gate-source voltage VGS, current does not flow between the source electrode and the drain electrode. The source electrode of PMOS transistor T6 and the node N1 are directly connected each other. Therefore, PMOS transistor T6 can supply the node N3 with current quickly. PMOS transistor T5 can cut off the current path between the node N1 and the current mirror circuit 102. Thus, PMOS transistor T5 can prevent an oversupply of the current to the current mirror circuit 201 as compared with the conventional semiconductor device.

The capacitance element C1 has two terminals. One terminal is connected to the node N3 and the other terminal is connected to the node N2.

Next, the operation of the semiconductor device according to the first preferred embodiment of the present invention will be described as follows.

When power turn on in the semiconductor device, the switch 103B is an OFF state and the voltage on the node N3 is second voltage. Since the node N3 and the gate electrode of PMOS transistor T5 are connected with each other, the voltage on the gate electrode of PMOS transistor T5 is also second voltage. Therefore, the switch 103A is an ON state. In other words, the gate-source voltage VGS occurs between the gate and source electrodes of PMOS transistor T5 and a current path occurs between the source and drain electrodes. Therefore, a current path occurs between the power supply voltage node VDD and the input terminal 102I through PMOS transistor T5.

Since the input terminal 102I and the gate electrode of NMOS transistor T3 are connected with each other, the voltage on the gate electrode of NMOS transistor T3 increases. Therefore, the gate-source voltage VGS occurs between the gate and source electrodes of NMOS transistor T3 and a current path occurs between the source and drain electrodes. A current path occurs between the input terminal 102I and the ground voltage node GND.

Since the gate electrodes of NMOS transistors T3 and T4 are connected with each other, the voltage on the gate electrode of NMOS transistor T4 also increases. Therefore, the gate-source voltage VGS occurs between the gate and source electrodes of NMOS transistor T4 and a current path occurs between the source and drain electrodes. A current path occurs between the ouput terminal 102O and the ground voltage node GND.

Since the output terminal 102O and the input terminal 101I are connected with each other, the voltage on the gate electrode of PMOS transistor T1 decreases. Therefore, the gate-source voltage VGS occurs between the gate and source electrodes of PMOS transistor T1 and a current path occurs between the source and drain electrodes. A current path occurs between the power supply voltage node VDD and the input terminal 101I. Thus, a current path occurs between the power supply voltage node VDD and the ground voltage node GND through PMOS transistor T1 and NMOS transistor T4.

Since the gate electrodes of PMOS transistors T1 and T2 are connected with each other, the voltage on the gate electrode of PMOS transistor T4 also decreases. Therefore, the gate-source voltage VGS occurs between the gate and source electrodes of PMOS transistor T1 and a current path occurs between the source and drain electrodes. A current path occurs between the power supply voltage node VDD and the output terminal 101O. Thus, a current path occurs between the power supply voltage node VDD and the ground voltage node GND through PMOS transistor T2 and NMOS transistor T3.

On the other hand, since the gate electrodes of PMOS transistors T1 and T6 are connected with each other, the voltage level on the gate electrode of PMOS transistor T6 also decreases. Therefore, the switch 103B is an ON state. In other words, the gate-source voltage VGS occurs between the gate and source electrodes of PMOS transistor T6 and a current path occurs between the source and drain electrodes. Therefore, a current path occurs between the power supply voltage node VDD and the node N3 through PMOS transistor T6. Current flows toward the node N3 and the capacitance element C1 from the node N1. The capacitance element C1 stores an electrical charge gradually until the capacity of the capacitance element C1 becomes full. The voltage on the node N3 increases gradually to a certain voltage until the capacity becomes full. When the capacity becomes full, current stops flowing toward the node N3 and the capacitance element C1 and the voltage on the node N3 keeps the certain voltage for a while. At this time, the voltage on the gate electrode of PMOS transistor T5 also is the certain voltage. The switch 103A is an OFF state. In other words, the gate-source voltage VGS does not occur between the gate and source electrodes of PMOS transistor T5. Current does not flow between the source and drain electrodes. Therefore, a current path between the power supply voltage node VDD and the input terminal 102I through PMOS transistor T5 cuts off.

However, the current has been already flow at the input terminal 102I. Therefore, the semiconductor device according to the first preferred embodiment of the present invention can stably operate after the current path cuts off.

The semiconductor device according to the first preferred embodiment of the present invention has the following effects.

The start-up circuit of the semiconductor device according to the first preferred embodiment of the present invention comprises two transistors and the capacitance element. Therefore, the number of the circuit elements of the semiconductor device according to the first preferred embodiment of the present invention is less than that of the conventional semiconductor device. Thus, the semiconductor device according to the first preferred embodiment of the present invention can operate by low current, low voltage and fast speed.

Furthermore, the first electrode of p-channel MOSFET T6 in the start-up circuit directly connects to the node N1 which is connected to the power supply voltage node VDD. Therefore, the semiconductor device according to the first preferred embodiment of the present invention can flow current to the node N3 quickly compared with the conventional semiconductor device. Thus, the voltage on the node N3 can be raised quickly and thus higher operation speed can be achieved.

(Second Embodiment)

Figure 2:
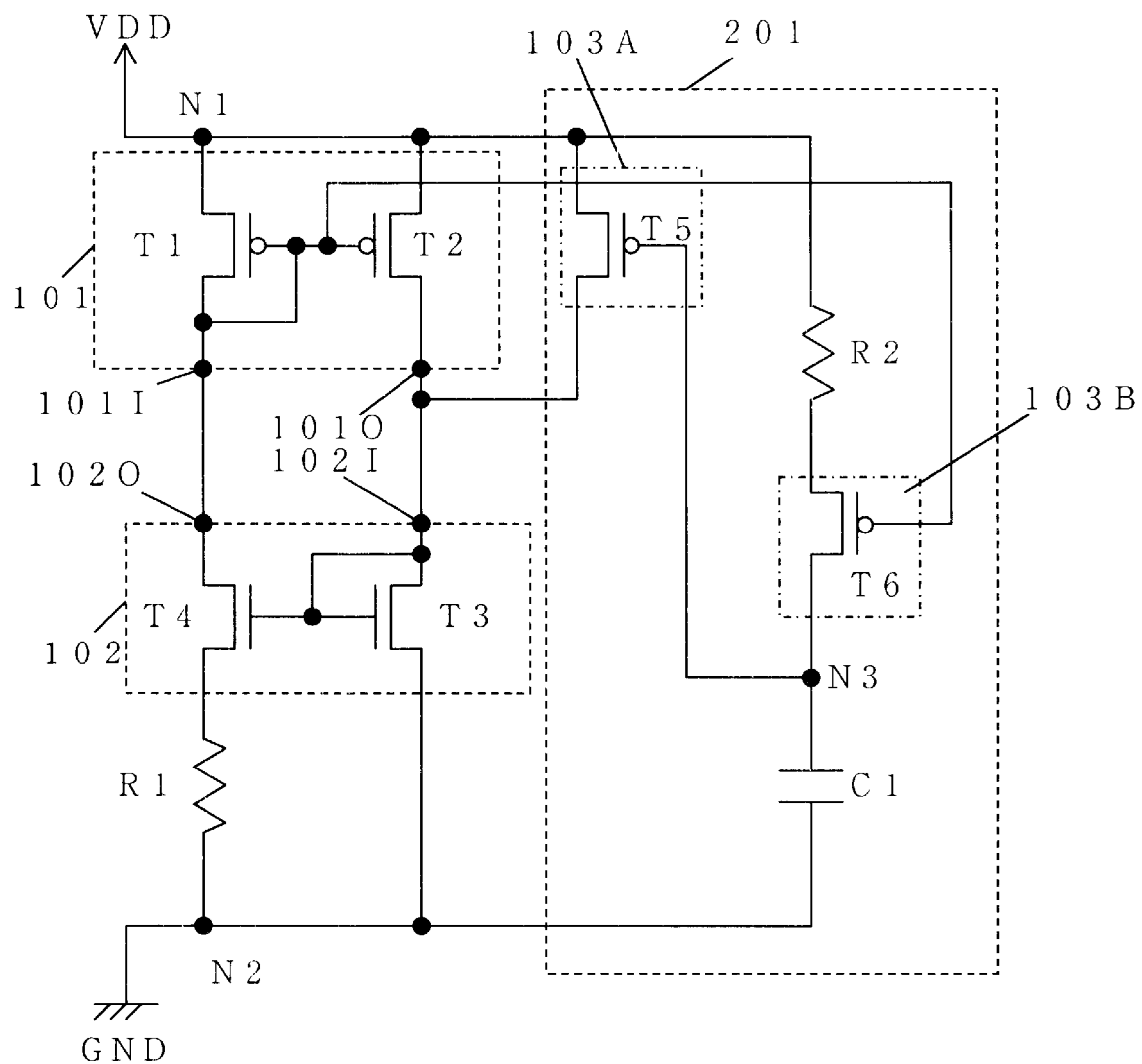
FIG. 2 is a circuit diagram showing a semiconductor device according to a second preferred embodiment of the present invention.

A semiconductor device according to a second preferred embodiment of the present invention will be described with reference to FIG. 2. FIG. 2 is a circuit diagram showing the semiconductor device according to the second preferred embodiment of the present invention. Like elements are given like or corresponding reference numerals in the first and second preferred embodiments. Thus, dual explanations of the same elements are avoided.

The semiconductor device according to the second preferred embodiment of the present invention comprises a node N1, a node N2, a current mirror circuit 101, a current mirror circuit 102, a resistor R1 and a start-up circuit 201.

The start-up circuit 201 comprises a first switch 103A and a second switch 103B, a node N3, a capacitance element C1 and a resistor R2. The difference between the first and the second preferred embodiments is that the resistor R2 is provided in the start-up circuit 201. The resistor R2 has two terminals. One terminal is connected to the node N1, the other terminal is connected with the source electrode of PMOS transistor T6. The resistor R2 comprises such as PMOS or NMOS transistor. When the resistor R2 comprises NMOS transistor, a gate electrode and a source electrode are connected to the node N1 and a drain electrode is connected to the source electrode. Therefore, first voltage is to indirectly supplied with the source electrode of PMOS transistor T6 through the resistor R2.

The semiconductor device according to the second preferred embodiment of the present invention has the follow-ing effect, in addition to the effects of the semiconductor device according to the first preferred embodiment.

The current amount flowing toward PMOS transistor T6 is less than compared with one of the first preferred embodiment of the present invention, because there is the resistor R2 between the node N1 and PMOS transistor T6. Therefore, the time for storing the electrical charge in the capacitance element C1 is longer than the first preferred embodiment of the present invention. It takes long time that the current path becomes to cut off. Therefore, current can be much flowed toward the input terminal 102I.

(Third Embodiment)

Figure 3:
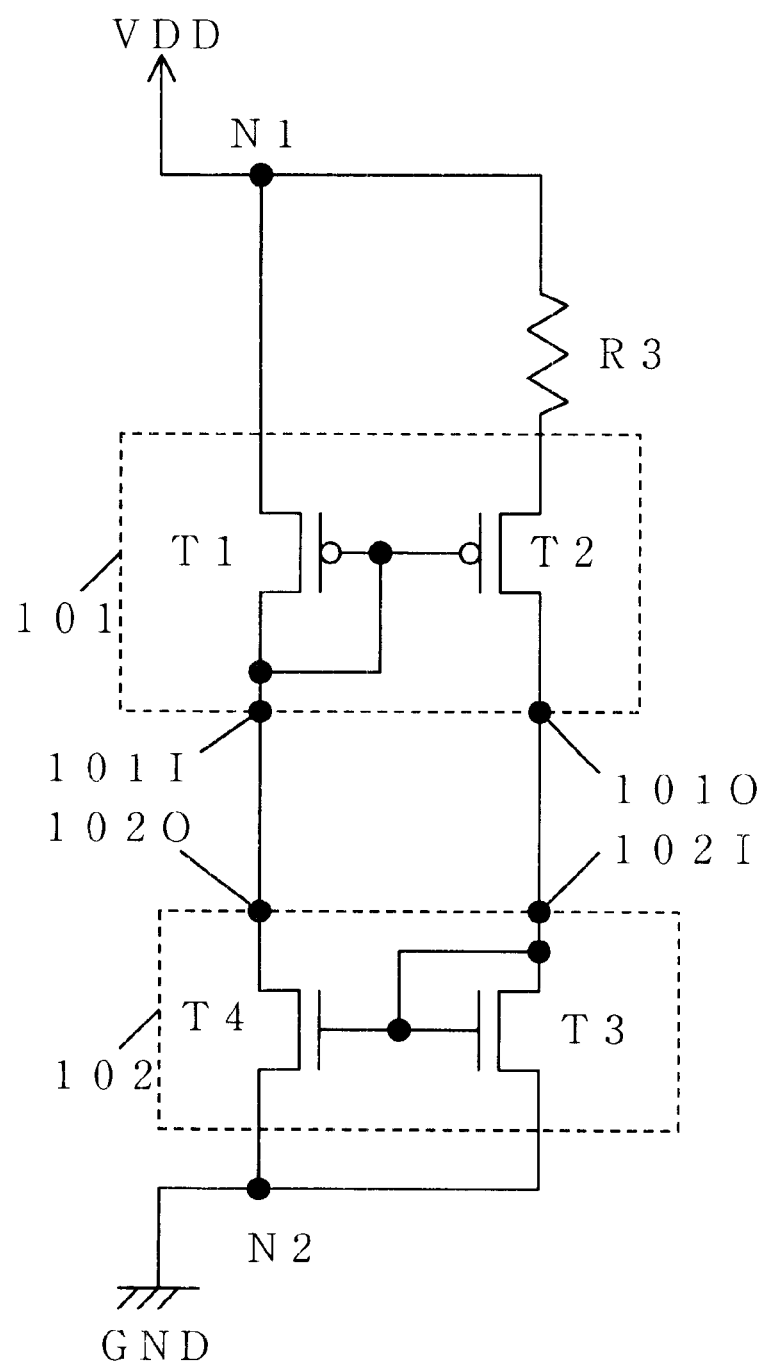
FIG. 3 is a partial circuit diagram showing a semiconductor device according to a third preferred embodiment of the present invention.

A semiconductor device according to a third preferred embodiment of the present invention will be described with reference to FIG. 3. FIG. 3 is a circuit diagram showing a part of the semiconductor device according to the third preferred embodiment of the present invention. The start-up circuit 103 or 201 is omitted from FIG. 3. Like elements are given like or corresponding reference numerals in the first through third preferred embodiments. Thus, dual explanations of the same elements are avoided.

The semiconductor device according to the third preferred embodiment of the present invention has a resistor R3 which is provided between the node N1 and PMOS transistor T2, instead of the resistor R1 according to the first preferred embodiment. The resistor R3 has two terminals. One terminal is connected to the node N1 and the other terminal is connected to the source electrode of the PMOS transistor T2. The resistor R3 comprises such as PMOS or NMOS transistor. When the resistor R3 comprises NMOS transistor, a gate electrode and a source electrode are connected to the node N1 and a drain electrode is connected to the source electrode. Therefore, the power supply voltage VDD is indirectly supplied with the source electrode of PMOS transistor T2 through the resistor R3. The source electrode of NMOS transistor T4 is directly connected to the node N2.

The semiconductor device according to the third preferred embodiment of the present invention can have the same effects being described in the first or second preferred embodiments of the present invention.

Furthermore, current on the input terminal 101I can be much flowed toward the ground voltage node GND.

(Fourth Embodiment)

Figure 4:
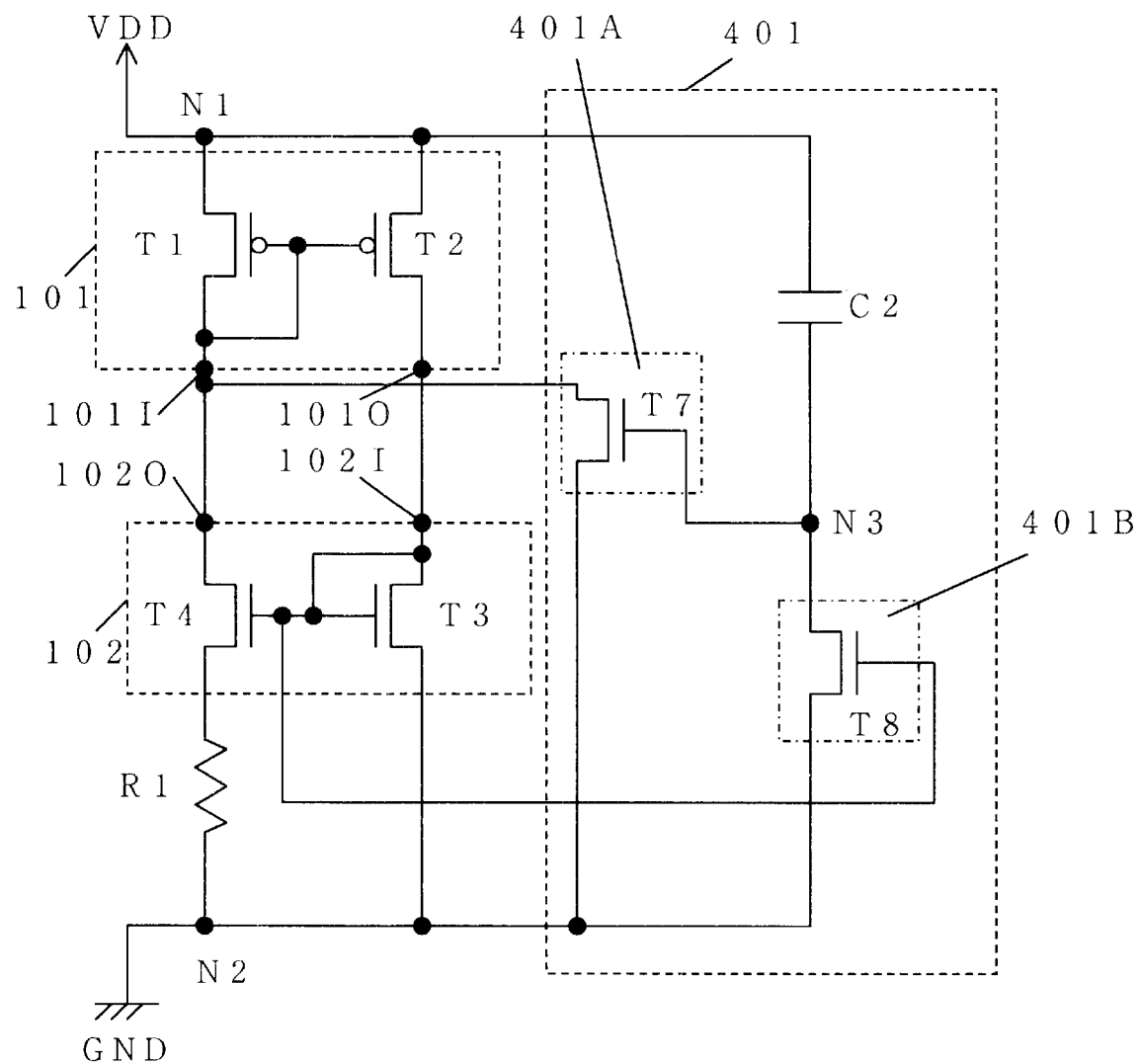
FIG. 4 is a circuit diagram showing a semiconductor device according to a fourth preferred embodiment of the present invention.

A semiconductor device according to a fourth preferred embodiment of the present invention will be described with reference to FIG. 4. FIG. 4 is a circuit diagram showing the semiconductor device according to the fourth preferred embodiment of the present invention. Like elements are given like or corresponding reference numerals in the first through fourth preferred embodiments. Thus, dual explanations of the same elements are avoided.

The start-up circuit 401 comprises a switch 401A, a switch 401B, a node N3 and a capacitance element C2, i.e. capacitor. The switches 401A and 401B have an ON state and an OFF state respectively. The switch 401A comprises NMOS transistor T7 and the switch 401B comprises NMOS transistor T8.

A gate electrode of NMOS transistor T7 is connected to the node N3. A source electrode is connected to the node N2 and a drain electrode is connected to the input terminal 101I of the current mirror circuit 101. When a certain amount of voltage (a gate-source voltage VGS) occurs between the gate and source electrodes of NMOS transistor T7, current flows between the source electrode and the drain electrode. When the gate-source voltage VGS does not occur between the gate and source electrodes, current does not flow between the source electrode and the drain electrode.

A gate electrode of NMOS transistor T8 is connected to the gate electrode of NMOS transistor T3 or T4 (or the input terminal 102I). NMOS transistor T4 and NMOS transistor T8 comprise a current mirror circuit. A source electrode of NMOS transistor T8 is connected to the node N2 and a drain electrode thereof is connected to the node N3. When the difference of voltage between the source electrode and the gate electrode of NMOS transistor T8 exceeds the gate-source voltage VGS, current flows between the source electrode and the drain electrode. When the difference of voltage between the source electrode and the gate electrode of NMOS transistor T8 does not exceed the gate-source voltage VGS, current does not flow between the source electrode and the drain electrode.

The capacitance element C2 has two terminals. One terminal is connected to the node N1 and the other terminal is connected to the node N3.

Next, the operation of the semiconductor device according to the fourth preferred embodiment of the present invention will be described as follows.

When power turn on in the semiconductor device, the switch 401B is an OFF state and the voltage on the node N3 is first voltage. Since the node N3 and the gate electrode of NMOS transistor T7 are connected with each other, the voltage on the gate electrode of NMOS transistor T7 is also first voltage. Therefore, the switch 401A is an ON state. In other words, the gate-source voltage VGS occurs between the gate and source electrodes of NMOS transistor T7 and a current path occurs between the source and drain electrodes. Therefore, a current path occurs between the ground voltage node GND and the input terminal 101I through NMOS transistor T7.

Since the input terminal 101I and the gate electrode of PMOS transistor T1 are connected with each other, the voltage on the gate electrode of PMOS transistor T1 decreases. Therefore, the gate-source voltage VGS occurs between the gate and source electrodes of PMOS transistor T1 and a current path occurs between the source and drain electrodes. A current path occurs between the power supply voltage node VDD and the input terminal 101I.

Since the gate electrodes of PMOS transistors T1 and T2 are connected with each other, the voltage on the gate electrode of PMOS transistor T2 also decreases. Therefore, the gate-source voltage VGS occurs between the gate and source electrodes of PMOS transistor T2 and a current path occurs between the source and drain electrodes. A current path occurs between the power supply voltage node VDD and the output terminal 101O.

Since the output terminal 101O and the input terminal 102I are connected with each other, the voltage on the gate electrode of NMOS transistor T3 increases. Therefore, the gate-source voltage VGS occurs between the gate and source electrodes of NMOS transistor T3 and a current path occurs between the source and drain electrodes. A current path occurs between the input terminal 102I and the ground voltage node GND. Thus, a current path occurs between the power supply voltage node VDD and the ground voltage node GND through PMOS transistor T2 and NMOS transistor T3.

Since the gate electrodes of NMOS transistors T3 and T4 are connected with each other, the voltage on the gate electrode of NMOS transistor T4 also decreases. Therefore, the gate-source voltage VGS occurs between the gate and source electrodes of NMOS transistor T4 and a current path occurs between the source and drain electrodes. A current path occurs between the output terminal 102O and the ground voltage node GND. Thus, a current path occurs is between the power supply voltage node VDD and the ground voltage node GND through PMOS transistor T1 and NMOS transistor T4.

On the other hand, since the gate electrodes of NMOS transistors T4 and T8 are connected with each other, the voltage level on the gate electrode of NMOS transistor T8 also increases. Therefore, the switch 401B is an ON state. In other words, the gate-source voltage VGS occurs between the gate and source electrodes of NMOS transistor T8 and a current path occurs between the source and drain electrodes. Therefore, a current path occurs between the node N3 and the ground voltage node GND through NMOS transistor T8. Current on the node N3 flows toward the ground voltage node GND through NMOS transistor T8. The capacitance element C1 discharges an electrical charge gradually until the capacity of the capacitance element C1 becomes empty. The voltage on the node N3 decreases gradually to a certain voltage until the capacity becomes empty. When the capacity becomes empty, current stops flowing toward the ground voltage node GND and the voltage on the node N3 keeps the certain voltage for a while. At this time, the voltage on the gate electrode of NMOS transistor T7 also is the certain voltage. The switch 401A is an OFF state. The gate-source voltage VGS does not occur between the gate and source electrodes of NMOS transistor T7. Current does not flow between the source and drain electrodes. Therefore, a current path between the ground voltage node GND and the input terminal 101I through NMOS transistor T7 cuts off.

However, the current has been already flow at the input terminal 101I. Therefore, the semiconductor device according to the fourth preferred embodiment of the present invention can stably operate after the current path cuts off.

The semiconductor device according to the fourth preferred embodiment of the present invention has the effects such as the first preferred embodiment. It goes without saying that the fourth preferred embodiment of the present invention can combine with either the second preferred embodiment or the third preferred embodiment. In that case, the semiconductor device according to the fourth preferred embodiment is capable of having the effect describing in the second preferred embodiment.

While the preferred form of the present invention has been described, it is to be understood that modifications will be apparent to those skilled in the art without departing from the spirit of the invention.

The scope of the invention, therefore, is to be determined solely by the following claims.

What is claimed is:

1. A semiconductor device, comprising:
    a first node which is provided a first voltage;
    a second node which is provided a second voltage, wherein said second voltage is lower than said first voltage;
    a first current mirror circuit which has an input terminal and an output terminal, wherein said first current mirror circuit is coupled with said first node;
    a second current minor circuit which has an input terminal and an output terminal wherein said input terminal of said second current mirrors circuit is coupled with said output terminal of said first current mirror circuit, wherein said output terminal of said second current mirror circuit is coupled with said input terminal of said first current mirror circuit and wherein said second current mirror circuit is coupled with said second node; and
    a startup circuit which supplies a current of the first node to said input terminal of said second current mirror circuit based on a voltage on said input terminal of said first current mirror circuit, wherein said startup circuit comprises:
- a third node;
- a capacitance element which is coupled between said third node and said second node;
- a resistor which is coupled with said first node;
- a first transistor which has an ON state and an OFF state, and which is coupled between said first node and said input terminal of said second current mirror circuit; and
- a second transistor which is coupled between said resistor and said third node, and which supplies the current of said first node to said third node based on the voltage on the input terminal of said first current mirror circuit.

2. The semiconductor device in accordance with claim 1, wherein said first transistor has a control electrode coupling with said third node, a first electrode coupling with said first node and a second electrode coupling with said input terminal of said second current mirror circuit, and wherein said second transistor has a control electrode coupling with said input terminal of said first current mirror circuit, a first electrode coupling with said resistor and a second electrode coupling with said third node.

3. The semiconductor device in accordance with claim 2, wherein first current mirror circuit has a third transistor which has a first electrode coupling with said first node and a control and a second electrodes coupling with said input terminal thereof, and a fourth transistor which has a first electrode coupling with said first node, a control electrode coupling with said control electrode of said third transistor and a second electrode coupling with said output terminal thereof; and wherein said second current mirror circuit has a fifth transistor which has a first electrode coupling with said second node and a control and a second electrodes coupling with said input terminal thereof, and a sixth transistor which has a first electrode coupling with said second node through a resistor, a control electrode coupling with said control electrode of said fifth transistor and a second electrode coupling with said output terminal thereof.

4. The semiconductor device in accordance with claim 2, wherein first current mirror circuit has a third transistor which has a first electrode coupling with said first node and a control and a second electrodes coupling with said input terminal thereof, and a fourth transistor which has a first electrode coupling with said first node through a resistor, a control electrode coupling with said control electrode of said third transistor and a second electrode coupling with said output terminal thereof; and wherein said second current mirror circuit has a fifth transistor which has a first electrode coupling with said second node and a control and a second electrodes coupling with said input terminal thereof, and a sixth transistor which has a first electrode coupling with said second node, a control electrode coupling with said control electrode of said fifth transistor and a second electrode coupling with said output terminal thereof.

* * * * *